United States Patent
Yano et al.

(10) Patent No.: US 8,753,548 B2
(45) Date of Patent: Jun. 17, 2014

(54) COMPOSITE OXIDE SINTERED BODY AND SPUTTERING TARGET COMPRISING SAME

(75) Inventors: Koki Yano, Sodegaura (JP); Hirokazu Kawashima, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 69 days.

(21) Appl. No.: 13/133,801

(22) PCT Filed: Dec. 7, 2009

(86) PCT No.: PCT/JP2009/006661
§ 371 (c)(1),
(2), (4) Date: Jun. 9, 2011

(87) PCT Pub. No.: WO2010/067571
PCT Pub. Date: Jun. 17, 2010

(65) Prior Publication Data
US 2011/0260121 A1    Oct. 27, 2011

(30) Foreign Application Priority Data
Dec. 12, 2008   (JP) .................................. 2008-317037

(51) Int. Cl.
*H01B 1/02* (2006.01)
(52) U.S. Cl.
USPC .............. 252/519.51; 174/126.2; 204/192.26; 204/298.13; 257/43; 428/1.1
(58) Field of Classification Search
USPC .............. 252/519.51; 174/126.2; 204/192.13, 204/298.13; 257/43; 428/1.1
See application file for complete search history.

(56) References Cited

U.S. PATENT DOCUMENTS

| | | | |
|---|---|---|---|
| 7,897,067 B2* | 3/2011 | Inoue ....................... | 252/519.51 |
| 8,304,359 B2* | 11/2012 | Yano et al. ................... | 501/126 |
| 2007/0194379 A1 | 8/2007 | Hosono et al. | |
| 2009/0278122 A1 | 11/2009 | Hosono et al. | |
| 2009/0280600 A1 | 11/2009 | Hosono et al. | |
| 2009/0308635 A1 | 12/2009 | Yano et al. | |
| 2010/0155717 A1 | 6/2010 | Yano et al. | |
| 2010/0170696 A1 | 7/2010 | Yano et al. | |
| 2010/0266787 A1 | 10/2010 | Yano et al. | |
| 2011/0260121 A1 | 10/2011 | Yano et al. | |
| 2013/0112971 A1 | 5/2013 | Yano et al. | |

FOREIGN PATENT DOCUMENTS

| | | | | |
|---|---|---|---|---|
| CN | 1379827 A | 11/2002 | | |
| CN | 101 258 263 | 9/2008 | | |
| JP | 05 148637 | 6/1993 | | |
| JP | 05-148637 | * 6/1993 | .............. | C23C 14/34 |

(Continued)

OTHER PUBLICATIONS

International Search Report of PCT/JP2009/006661 (Feb. 22, 2010).

(Continued)

*Primary Examiner* — Khanh Tuan Nguyen
(74) *Attorney, Agent, or Firm* — Millen, White, Zelano & Branigan, P.C.

(57) ABSTRACT

A composite oxide sintered body includes In, Zn, and Sn, and has a relative density of 90% or more, an average crystal grain size of 10 μm or less, and a bulk resistance of 30 mΩcm or less, the number of tin oxide aggregate particles having a diameter of 10 μm or more being 2.5 or less per $mm^2$ of the composite oxide sintered body.

7 Claims, 1 Drawing Sheet

(56) References Cited

FOREIGN PATENT DOCUMENTS

| | | | | |
|---|---|---|---|---|
| JP | 11 256321 | | 9/1999 | |
| JP | 2001-126538 | * | 5/2001 | ............... H01B 5/14 |
| JP | 2003-064471 | * | 3/2003 | ............... C23C 14/34 |
| JP | 2003-64471 A | | 3/2003 | |
| JP | 2005-154820 A | | 6/2005 | |
| JP | 2007 031786 | | 2/2007 | |
| JP | 2007-63649 A | | 3/2007 | |
| JP | 2007 223852 | | 9/2007 | |
| JP | 2007 314364 | | 12/2007 | |
| JP | 2008-280216 A | | 11/2008 | |
| JP | 5145513 B2 | | 2/2013 | |
| TW | 200845399 | | 11/2008 | |
| WO | WO 2005/088726 A1 | | 9/2005 | |
| WO | WO 2007/034749 A1 | | 3/2007 | |
| WO | WO 2007/037191 A1 | | 4/2007 | |

OTHER PUBLICATIONS

International Preliminary Report on Patentability of PCT/JP2009/006661 (Jul. 5, 2011).
K.J. Saji et al., "Optical and Carrier Transport Properties of Cosputtered Zn—In—Sn—O Films and Their Applications to TFTs", Journal of the Electrochemical Society, vol. 155, No. 6 (2008) pp. H390-H395.
Idemitsu Kosan Co Ltd., "Sputtering target, manufacturing method therefore and transparent electroconductive film," Patent Abstract of Japan, Publication Date: Feb. 8, 2007; English Abstract of JP-2007 031786.
Nikko Kyodo Co Ltd., "Ito sputtering target," Patent Abstracts of Japan, Publication Date: Jun. 15, 1993; English Abstract of JP-05 148637.
Office Action for related Japanese Patent Application No. 2010-542008 dated Jul. 10, 2012.
Partial English Translation of Office Action for related Japanese Patent Application No. 2010-542008 dated Jul. 10, 2012.
Sumitomo Metal Mining Co Ltd., "Oxide sintered compact, target, oxide transparent conductive film obtained by using the same and method of manufacturing the same," Patent Abstracts of Japan, Publication Date: Dec. 6, 2007; English Abstract of JP-2007 314364.
Sumitomo Metal Mining Co Ltd., "ZNO Base sintered compact," Patent Abstracts of Japan, Publication Date: Sep. 21, 1999; English Abstract of JP-11 256321.
Tosoh Corp., "Electrically conductive ceramic sintered compact and sputtering target as well as manufacturing method thereof," Patent Abstracts of Japan, Publication Date: Sep. 6, 2007; English Abstract of JP-2007 223852: English Abstract of JP-2007 223852.
JP Office Action dated Jan. 14, 2014 issued in corresponding JP 2012-126732 application (pp. 1-5).
Chinese Office Action dated Mar. 11, 2014 issued in corresponding CN 200980149720.1 application (pp. 1-3).
English abstract of CN1379827, Publication Date: Nov. 13, 2002.

* cited by examiner

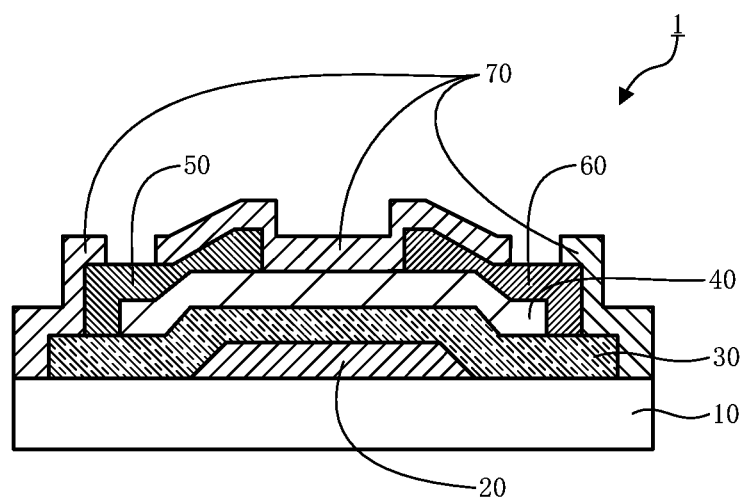

COMPOSITE OXIDE SINTERED BODY AND SPUTTERING TARGET COMPRISING SAME

TECHNICAL FIELD

The invention relates to a composite oxide sintered body that includes In, Zn and Sn, a sputtering target that includes the same, an amorphous oxide film obtained using the sputtering target, and a thin film transistor that includes the oxide film.

BACKGROUND ART

A field effect transistor has been widely used as a unit electronic device of a semiconductor memory integrated circuit, a high-frequency signal amplifier device, a liquid crystal drive device, and the like. The field effect transistor is an electronic device that is most widely put to practical use at present.

In recent years, development of displays has rapidly progressed, and a thin film transistor (TFT) has been widely used for a display (e.g., liquid crystal display (LCD), electroluminescence (EL) display, or field emission display (FED)) as a switching device for driving a display by applying a driving voltage to the display element.

A silicon semiconductor compound is most widely used as a material for the thin film transistor. A silicon single crystal is generally used for a high-frequency signal amplifier device, an integrated circuit device, and the like for which a high-speed operation is required, and amorphous silicon is generally used for a liquid crystal drive device and the like for which an increase in area is required.

However, since a high temperature (e.g., 800° C. or more) is required to crystallize a crystalline silicon thin film, it is difficult to form a crystalline silicon thin film on a glass substrate or an organic substrate. Therefore, a crystalline silicon thin film can only be formed on an expensive heat-resistant substrate (e.g., silicon wafer or quartz). Moreover, a large amount of energy and a large number of steps are required to produce a crystalline silicon thin film.

Since the device structure of a thin film transistor (TFT) that utilizes a crystalline silicon thin film is normally limited to a top-gate structure, it is difficult to reduce cost by reducing the number of masks, for example.

An amorphous silicon semiconductor (amorphous silicon) thin film can be formed at a relatively low temperature, but can achieve a low switching speed as compared with a crystalline silicon thin film. Therefore, when using an amorphous silicon semiconductor thin film for a switching device for driving a display, a high-speed animation may not be displayed.

A silicon-based semiconductor film is mainly used for a switching device that drives a display. This is because a silicon-based thin film exhibits excellent stability, excellent workability, a high switching speed, and the like. A silicon-based thin film is generally formed by chemical vapor deposition (CVD).

A thin film transistor (TFT) may have an inverted staggered structure in which a gate electrode, a gate insulating layer, a semiconductor layer (e.g., hydrogenated amorphous silicon (a-Si:H)), a source electrode, and a drain electrode are stacked on a substrate (e.g., glass substrate). In the field of large-area devices (e.g., image sensors), a thin film transistor (TFT) having an inverted staggered structure is used as a driver device of a flat panel display (e.g., active matrix liquid crystal display). When using amorphous silicon in such an application, an increase in operation speed has been desired along with enhancement in functionality.

In view of the above situation, an oxide semiconductor thin film that exhibits excellent stability as compared with a silicon-based semiconductor thin film has attracted attention.

However, it is difficult to industrially apply a transparent semiconductor thin film formed of a metal oxide (particularly a transparent semiconductor thin film formed by crystallizing zinc oxide at a high temperature) due to low field-effect mobility (hereinafter may be referred to simply as "mobility") (about 1 $cm^2$/·sec), a small on-off ratio, and occurrence of leakage current.

A crystalline oxide semiconductor that contains zinc oxide has been extensively studied, but has the following problems when film formation is conducted by sputtering which is normally conducted on an industrial scale.

For example, an oxide semiconductor film formed of a conductive transparent oxide that contains zinc oxide as the main component tends to produce a large number of carrier electrons due to oxygen defects. This makes it difficult to reduce conductivity. Moreover, an abnormal discharge occurs during film formation by sputtering, so that the film formation stability is impaired. This results in deterioration in uniformity and reproducibility of the resulting film.

Therefore, when using an oxide semiconductor film formed of a conductive transparent oxide that contains zinc oxide as the main component as an active layer (channel layer) of a thin film transistor (TFT), for example, a large amount of current flows between the source electrode and the drain electrode even if the gate voltage is not applied (i.e., a normally-off operation cannot be implemented). It is also difficult to increase the on-off ratio of the transistor.

Moreover, the resulting thin film transistor (TFT) may exhibit poor TFT characteristics (e.g., low mobility, small on-off ratio, a large amount of leakage current, unclear pinch-off, and tendency to be normally-on state), and may not be produced by wet etching due to poor chemical resistance. Therefore, the production process and the usage environment are limited.

An oxide semiconductor film formed of a conductive transparent oxide that contains zinc oxide as the main component must be formed under high pressure (i.e., the film-forming rate decreases) in order to improve the characteristics, and requires a high-temperature process (700° C. or more). This makes industrial production difficult. A thin film transistor (TFT) that utilizes an oxide semiconductor film formed of a conductive transparent oxide that contains zinc oxide as the main component exhibits poor TFT characteristics (e.g., mobility) when using a bottom-gate structure. It is necessary to employ a top-gate structure and increase the film thickness to 100 nm or more in order to improve the TFT characteristics.

In order to solve the above problems, use of an amorphous oxide semiconductor film that contains indium oxide, gallium oxide, and zinc oxide for a thin film transistor has been studied. Production of an amorphous oxide semiconductor film that contains indium oxide, gallium oxide, and zinc oxide by sputtering that ensures high mass productivity on an industrial scale has also been studied. However, gallium is a trace metal, and increases the raw material cost. Moreover, the characteristics (e.g., mobility and S value) of the transistor deteriorate when a large amount of gallium is added.

Patent Document 1 and Non-patent Document 1 disclose a thin film transistor that utilizes an amorphous oxide semiconductor film that contains indium oxide, tin oxide, and zinc oxide, but does not contain gallium. A sputtering target that is used for an optical information recording medium and contains tin oxide as the main component has been studied (Patent Document 2). However, practical applications of a sputtering target for forming an oxide semiconductor have not been specifically studied.

An effect of reducing the number of tin aggregates has been studied in order to suppress generation of nodules of an ITO target for forming a transparent conductive film (Patent Document 3). However, the most excellent target contains tin aggregates in an amount of about 2.6 per mm², and an effect of further reducing the number of tin aggregates in an oxide semiconductor application has not been studied.

RELATED ART DOCUMENTS

Patent Documents

Patent Document 1: WO05/088726
Patent Document 2: JP-A-2005-154820
Patent Document 3: JP-A-2003-64471
Non-patent Document 1: Kachirayil J. Saji et al., JOURNAL OF THE ELECTROCHEMICAL SOCIETY, 155(6), H390-395 (2008)

SUMMARY OF THE INVENTION

An object of the invention is to provide a composite oxide sintered body that makes it possible to produce a TFT panel while improving the uniformity and reproducibility of the TFT characteristics and the yield of the TFT, and a sputtering target including the composite oxide sintered body.

The inventors of the invention conducted extensive studies in order to achieve the above object, and found that an amorphous oxide film produced using a sputtering target that includes a composite oxide sintered body that has a small crystal grain size and includes indium, tin, and zinc improves the uniformity and reproducibility of the TFT characteristics and the yield of the TFT (particularly the yield of the TFT). In particular, the inventors found that an amorphous oxide film produced using a sputtering target that includes a composite oxide sintered body that has a small number of tin oxide aggregate particles and a small average hole count and includes indium, tin, and zinc improves the uniformity and reproducibility of the TFT characteristics and the yield of the TFT (particularly the yield of the TFT).

The invention provides the following composite oxide sintered body and the like.

1. A composite oxide sintered body comprising In, Zn, and Sn, and having a relative density of 90% or more, an average crystal grain size of 10 μm or less, and a bulk resistance of 30 mΩcm or less, the number of tin oxide aggregate particles having a diameter of 10 μm or more being 2.5 or less per mm².

2. The composite oxide sintered body according to 1, the composite oxide sintered body having a variation in relative density in a plane direction of 1% or less, and an average hole count of 800 or less per mm².

3. The composite oxide sintered body according to 1 or 2, wherein the atomic ratio of In, Zn, and Sn satisfies the following expressions:

$0<In/(In+Sn+Zn)<0.75,$ $0.25 \leq Zn/(In+Sn+Zn) \leq 0.75,$ and $0<Sn/(In+Sn+Zn)<0.50.$ 4. The composite oxide sintered body according to any one of 1 to 3, the composite oxide sintered body having a nitrogen content of 5 ppm or less.

5. A method of producing a composite oxide sintered body comprising producing a shaped body using an indium oxide powder having a specific surface area of 4 to 14 m²/g, a tin oxide powder having a specific surface area of 4 to 14 m²/g, and a zinc oxide powder having a specific surface area of 2 to 13 m²/g, and sintering the shaped body at 1200 to 1550° C.

6. The method according to 5, the method comprising mixing an indium oxide powder having a specific surface area of 6 to 10 m²/g, a tin oxide powder having a specific surface area of 5 to 10 m²/g, and a zinc oxide powder having a specific surface area of 2 to 4 m²/g to obtain a powder mixture having a specific surface area of 5 to 8 m²/g, increasing the specific surface area of the powder mixture by 1.0 to 3.0 m²/g by mixing and grinding the powder mixture using an agitator bead mill with a wet medium, forming the powder mixture that has been increased in specific surface area to obtain a shaped body, and sintering the shaped body at 1250 to 1450° C. in an oxygen atmosphere.

7. A sputtering target comprising the composite oxide sintered body according to any one of 1 to 4.

8. The sputtering target according to 7, wherein metal atoms included in the composite oxide sintered body consist essentially of In, Sn, and Zn, and the ratio of the metal atoms satisfies the following expressions:

$0<In/(In+Sn+Zn)<0.40,$ $0.25 \leq Zn/(In+Sn+Zn)<0.70,$ and $0.05<Sn/(In+Sn+Zn)<0.25.$ 9. An amorphous oxide film obtained by sputtering using the sputtering target according to 7 or 8 at a film-forming temperature between room temperature and 450° C., the amorphous oxide film having an electron carrier density of less than $10^{18}/cm^3$.

10. A thin film transistor comprising the amorphous oxide film according to 9 as a channel layer.

The invention thus provides a composite oxide sintered body that makes it possible to produce a TFT panel while improving the uniformity and reproducibility of the TFT characteristics and the yield of the TFT, and a sputtering target including the same.

BRIEF DESCRIPTION OF THE DRAWINGS

FIG. 1 is a schematic cross-sectional view illustrating a thin film transistor according to one embodiment of the invention.

MODE FOR CARRYING OUT THE INVENTION

A composite oxide sintered body according to the invention includes In, Zn, and Sn, and has a density in terms of an average relative density of 90% or more, an average crystal grain size of 10 μm or less, and a bulk resistance of 30 mΩcm or less.

The composite oxide sintered body according to the invention includes In, Zn, and Sn as metal atoms. The composite oxide sintered body according to the invention may include oxygen deficiency, and may not satisfy the stoichiometric ratio.

The composite oxide sintered body according to the invention may further include an additional metal element such as Ga, Al, Ge, Si, Zr, Hf, or Cu.

The composite oxide sintered body according to the invention may consist essentially of In, Zn, and Sn together with an optional additional metal element such as Ga, Al, Ge, Si, Zr, Hf, or Cu, and oxygen, or may consist only of these components. The expression "consists essentially of" used herein means that the composite oxide sintered body consists of In, Zn, and Sn together with an optional additional metal element such as Ga, Al, Ge, Si, Zr, Hf, or Cu, and oxygen, and may also include an additional component insofar as the effects of the invention are not impaired.

The composite oxide sintered body according to the invention has a relative density of 90% or more, preferably 95% or more, and more preferably 98% or more. If the relative density of the composite oxide sintered body is less than 9014, the target may break during film formation, or the film-forming rate may decrease.

The term "relative density" refers to a value obtained by dividing the measured density by the theoretical density, and by multiplying the quotient by 100.

The composite oxide sintered body according to the invention has an average crystal grain size of 10 µm or less, preferably 6 µm or less, and more preferably 4 µm or less. If the composite oxide sintered body has an average crystal grain size of 10 µm or less, the bulk resistance of the composite oxide sintered body can be reduced, and the uniformity and the reproducibility of the TFT characteristics of the resulting thin film transistor can be improved.

The composite oxide sintered body according to the invention has a bulk resistance of 30 mΩcm or less, preferably 10 mΩcm or less, and more preferably 1 to 5 mΩcm. If the composite oxide sintered body has a bulk resistance of 30 mΩcm or less, the uniformity and the reproducibility of the TFT characteristics of the resulting thin film transistor can be improved.

In the composite oxide sintered body according to the invention, the number of tin oxide aggregate particles having a diameter of 10 µm or more is preferably 2.5 or less, more preferably 2 or less, still more preferably 1 or less, and particularly preferably 0.5 or less, per mm$^2$. If the number of tin oxide aggregate particles having a diameter of 10 µm or more is 2.5 or less per mm$^2$ the yield of the resulting thin film transistor can be improved. It is conjectured that the uniformity of the resistivity of the target is improved when the amount (number) of tin oxide aggregate particles is small, so that a stable discharge occurs, for example.

If the number of tin oxide aggregate particles having a diameter of 10 µm or more exceeds 2.5 per mm$^2$ of the composite oxide sintered body, it may be difficult to optimize the relative density, the average crystal grain size, and the bulk resistance of the composite oxide sintered body. Moreover, foreign matter (lower oxide of tin or indium) may be produced from tin oxide aggregate particles included in the composite oxide sintered body during continuous sputtering, so that small particles may be formed due to an abnormal discharge.

Note that the term "tin oxide aggregate particle" refers to a particulate substance formed of tin oxide. A tin oxide aggregate particle is produced when tin oxide used as the raw material remains in a separated state, for example. A tin oxide aggregate particle may be confirmed by performing area analysis of the composition using an X-ray microanalyzer (EPMA) or the like.

In the composite oxide sintered body according to the invention, the peak intensity I1 of a tin oxide phase (110) and the maximum peak intensity I2 of an oxide phase other than the tin oxide phase or a composite oxide phase that is present in the X-ray diffraction diagram within the range of 2θ=15 to 40° preferably satisfy the relationship "I1/I2<1", and more preferably satisfy the relationship "I1/I2<0.1". It is more preferable that the peak intensity I1 of the tin oxide phase (110) not be observed. If the relationship "I1/I2<1" is satisfied, the number of tin oxide aggregate particles can be reduced.

The composite oxide sintered body according to the invention preferably has a variation in relative density in the plane direction of 1% or less, and an average hole count of 800 or less per mm$^2$.

The composite oxide sintered body more preferably has a variation in relative density in the plane direction of 0.5% or less, and still more preferably 0.4% or less. If the composite oxide sintered body has a variation in relative density in the plane direction of 1% or less, the uniformity and the reproducibility of the TFT characteristics of the resulting thin film transistor can be improved.

Note that the term "plane direction" used herein refers to a direction along a side (erosion side) of the composite oxide sintered body that is ground when producing a target, and is irradiated with plasma.

The term "variation in relative density in the plane direction" used herein refers to a variation in density of a plurality of pieces obtained by cutting the sintered body along the side that is irradiated with plasma.

The composite oxide sintered body more preferably has an average hole count of 500 or less per mm$^2$, still more preferably 300 or less per mm$^2$, and particularly preferably 100 or less per mm$^2$. If the composite oxide sintered body has an average hole count of 800 or less per mm$^2$, the uniformity and the reproducibility of the TFT characteristics of the resulting thin film transistor can be improved.

The atomic ratio of In, Zn, and Sn included in the composite oxide sintered body according to the invention preferably satisfies the following expressions.

$$0<In/(In+Sn+Zn)<0.75$$

$$0.25 \leq Zn/(In+Sn+Zn) \leq 0.75$$

$$0<Sn/(In+Sn+Zn)<0.50$$

The atomic ratio of In, Zn, and Sn more preferably satisfies the following expressions.

$$0.05 \leq In/(In+Zn+Sn) \leq 0.60$$

$$0.35 \leq Zn/(In+Zn+Sn) \leq 0.65$$

$$\mathbf{0.05} \leq Sn/(In+Zn+Sn) \leq 0.30$$

The atomic ratio of In, Zn, and Sn still more preferably satisfies the following expressions.

$$0.18 \leq In/(In+Zn+Sn) \leq 0.45$$

$$\mathbf{0.45} \leq Zn/(In+Zn+Sn) \leq 0.60$$

$$\mathbf{0.10} \leq Sn/(In+Zn+Sn) \leq 0.22$$

If the atomic ratio of In, Zn, and Sn included in the composite oxide sintered body satisfies the above expressions, the TFT characteristics of the resulting thin film transistor can be improved. Moreover, wet etching can be facilitated when producing a thin film transistor.

The atomic ratio of In, Zn, and Sn included in a composite oxide sintered body according to another embodiment of the invention preferably satisfies the following expressions.

$$0<In/(In+Sn+Zn)<0.40$$

$$0.25 \leq Zn/(In+Sn+Zn)<0.70$$

$$0.05<Sn/(In+Sn+Zn)<0.25$$

The atomic ratio of In, Zn, and Sn more preferably satisfies the following expressions.

$$0.2 \leq \text{In}/(\text{In}+\text{Sn}+\text{Zn}) < 0.33$$

$$0.25 \leq \text{Zn}/(\text{In}+\text{Sn}+\text{Zn}) < 0.70$$

$$0.05 < \text{In}/(\text{In}+\text{Sn}+\text{Zn}) < 0.15$$

If the atomic ratio is within the above range, a target that has high relative density and low specific resistivity can be obtained while reducing the amount of In that is a trace metal. Moreover, a thin film transistor produced using a target in which the atomic ratio of In, Zn, and Sn is within the above range exhibits excellent TFT characteristics.

The composite oxide sintered body according to the invention preferably has a nitrogen content of 5 ppm (atomic ppm) or less. If the composite oxide sintered body has a nitrogen content of 5 ppm or less, the nitrogen content in the resulting semiconductor film decreases, so that the reliability and the uniformity of the resulting TFT can be improved.

If the composite oxide sintered body has a nitrogen content of higher than 5 ppm, an abnormal discharge of the resulting target may occur during sputtering, and the amount of gas adsorbed on the surface of the target may not be sufficiently reduced. Moreover, nitrogen and indium included in the target may react during sputtering to produce black indium nitride (InN), which may be mixed in the semiconductor film, and may decrease the yield. It is assumed that nitrogen atoms become mobile ions when the nitrogen content is higher than 5 ppm, and gather at the semiconductor interface to form a trap due to gate voltage stress, or nitrogen serves as a donor, and decreases the performance.

The composite oxide sintered body according to the invention preferably includes the spinel structure compound shown by $\text{Zn}_2\text{SnO}_4$. If the composite oxide sintered body includes the spinel structure compound shown by $\text{Zn}_2\text{SnO}_4$, the relative density can be increased, and the bulk resistance can be reduced.

The presence of the spinel structure compound shown by $\text{Zn}_2\text{SnO}_4$ in the composite oxide sintered body may be confirmed by an X-ray diffraction method.

A method of producing a composite oxide sintered body according to the invention utilizes an indium oxide powder, a zinc oxide powder, and a tin oxide powder as raw material powders. A composite oxide of these compounds or the like may be used as the raw material powder.

The purity of each raw material powder is normally 99.9% (3N) or more, preferably 99.99% (4N) or more, more preferably 99.995% or more, and particularly preferably 99.999% (5N) or more. If the purity of each raw material powder is less than 99.9% (3N), deterioration in semiconductor properties, reliability, and the like may occur due to impurities. In particular, if the Na content in each raw material powder is less than 100 ppm, the reliability of the resulting thin film transistor is preferably improved.

The method of producing a composite oxide sintered body according to the invention utilizes an indium oxide powder having a specific surface area of 4 to 14 $m^2/g$, a tin oxide powder having a specific surface area of 4 to 14 $m^2/g$, and a zinc oxide powder having a specific surface area of 2 to 13 $m^2/g$ as starting raw materials, and more preferably utilizes a powder mixture having a specific surface area of 5 to 8 $m^2/g$ as a starting raw material, the powder mixture being prepared by mixing an indium oxide powder having a specific surface area of 6 to 10 $m^2/g$, a tin oxide powder having a specific surface area of 5 to 10 $m^2/g$, and a zinc oxide powder having a specific surface area of 2 to 4 $m^2/g$.

The number of tin oxide aggregate particles included in the resulting composite oxide sintered body can be reduced by utilizing the above starting raw materials, so that the yield of the resulting thin film transistor can be improved. Moreover, a variation in relative density of the resulting composite oxide sintered body can be reduced, so that the uniformity and the reproducibility of TFT characteristics can be improved.

Each raw material powder preferably has almost the same specific surface area. This makes it possible to more efficiently achieve grinding and mixing described later. The ratio of the specific surface area of each raw material powder is preferably 1/4 to 4/1, and more preferably 1/2 to 2/1. If the ratio of the specific surface area of each raw material powder is outside the above range, it may be difficult to efficiently achieve grinding and mixing, so that the raw material powder particles may remain in the sintered body.

The mixing ratio of the indium oxide powder, the tin oxide powder, and the zinc oxide powder is not particularly limited, but is preferably 25 to 65:5 to 30:5 to 70, and more preferably 35 to 55:10 to 25:20 to 55. If the mixing ratio of the indium oxide powder, the tin oxide powder, and the zinc oxide powder is within the above range, it is possible to efficiently achieve mixing.

The starting raw materials are mixed and ground using an agitator bead mill with a wet medium or the like to prepare a powder mixture. In this case, the starting raw materials are preferably ground so that the specific surface area of the powder mixture is increased by 1.0 to 3.0 $m^2/g$ due to mixing and grinding, or the ground powder mixture has an average median diameter of about 0.6 to about 1 μm.

Note that the mixing method is not particularly limited. The starting raw materials may be mixed by a dry method.

Use of the above powder mixture makes it possible to obtain a composite oxide sintered body having a high density without performing a pre-firing step and a reduction step. The production process is simplified by omitting a pre-firing step. Moreover, production of tin oxide aggregate particles due to a pre-firing step can be prevented, so that the number of tin oxide aggregate particles can be reduced. It is also possible to prevent a situation in which a variation in composition and a variation in relative density increase due to sublimation of zinc that may occur during a pre-firing step.

If the specific surface area of the powder mixture is increased by less than 1.0 $m^2/g$ due to mixing and grinding, or the ground powder mixture has an average median diameter of more than 1 μm, the sintered density of the resulting composite oxide sintered body may not sufficiently increase. If the specific surface area of the powder mixture is increased by more than 3.0 $m^2/g$ due to mixing and grinding, or the ground powder mixture has an average median diameter of less than 0.6 μm, contamination (i.e., the amount of impurities mixed) from a grinder or the like during grinding may increase.

Note that the specific surface area may be measured by the BET method, and the average median diameter may be measured using a grain size distribution analyzer. The specific surface area and the average median diameter may be adjusted by grinding the powder mixture by a dry grinding method, a wet grinding method, or the like.

The powder mixture is then formed to obtain a shaped body. The powder mixture may be formed by a wet method or dry method which has conventionally been known.

Examples of the dry method include a cold press method, a hot press method, and the like.

When using a cold press method, the ground powder mixture is dried using a spray dryer or the like, and shaped to obtain a shaped body. The powder mixture may be formed by pressing, cold isostatic pressing, die shaping, casting, injection molding, or the like. It is preferable to form the powder mixture by pressing such as cold isostatic pressing (CIP) in order to obtain a sintered body (target) having a high sintered density.

The powder mixture is preferably dried (granulated) using a spray dryer. The powder mixture may be granulated by air-drying. In this case, however, the $SnO_2$ powder, the $In_2O_3$ powder, and the ZnO powder may be separated due to a difference in sedimentation rate caused by the difference in specific gravity between the raw material powders, so that a uniform granulated powder may not be obtained. If a sintered body is produced using such a non-uniform granulated powder, tin oxide may aggregate, or a variation in relative density may increase. As a result, the yield of the resulting TFT may decrease, or a variation in yield of the TFT may increase. The above problem does not occur when granulating the powder mixture using a spray dryer since the powder mixture can be quickly dried.

A filtration shaping method (see JP-A-11-286002) may be used as the wet method, for example. The filtration shaping method includes removing (discharging) water from ceramic raw material slurry under reduced pressure to obtain a shaped body.

A shaping aid such as polyvinyl alcohol, methyl cellulose, poly wax, or oleic acid may be used when forming the raw material.

The resulting shaped body is then sintered to produce a composite oxide sintered body.

The shaped body may be sintered in an oxygen atmosphere while circulating oxygen, or may be sintered under pressure.

When sintering the shaped body in an oxygen atmosphere, the oxygen flow rate is preferably 2 to 20 l/min, and more preferably 3 to 15 l/min. Vaporization of zinc can be suppressed by sintering the shaped body in an oxygen atmosphere, so that a composite oxide sintered body that has a small average hole count, contains a small number of tin oxide aggregate particles, has high relative density and a small variation in relative density, and is free from voids can be obtained. Moreover, since the nitrogen content in the sintered body can be reduced (i.e., the density of the sintered body can be increased) by sintering the shaped body in an oxygen atmosphere, occurrence of nodules and production of particles during sputtering can be suppressed, so that an oxide semiconductor film having excellent characteristics can be obtained. If the oxygen flow rate is outside the above range, oxygen deficiency may be suppressed due to introduction of oxygen, so that the specific resistivity of the sintered body may increase.

The sintering temperature is 1200 to 1550° C., and preferably 1250 to 1450° C. If the sintering temperature is 1200° C. or more, the relative density of the sintered body can be improved, and a variation in relative density can be reduced. Moreover, the average hole count can be reduced. If the sintering temperature is 1550° C. or less, an increase in crystal grain size can be suppressed, and the average hole count can be reduced.

The sintering time is normally 1 to 60 hours, preferably 2 to 40 hours, and particularly preferably 3 to 30 hours. If the sintering time is 1 hour or more, the relative density of the sintered body can be improved, and a variation in relative density can be reduced. If the sintering time is 60 hours or less, an increase in crystal grain size can be suppressed, and the average hole count can be reduced.

When sintering the shaped body, it is preferable to employ a temperature increase rate of 30° C./h or more at a temperature of 1000° C. or more, and employ a temperature decrease rate of 30° C./h or more during cooling. If the temperature increase rate at a temperature of 1000° C. or more is less than 30° C./h, the number of holes (pinholes) may increase due to decomposition of the oxide. If the temperature decrease rate during cooling is less than 30° C./h, the compositional ratio of the resulting composite oxide sintered body may change.

The method of producing a composite oxide sintered body according to the invention may include a reduction step.

The reduction step is arbitrarily performed to reduce the resulting sintered body so that the entire sintered body has uniform bulk resistance.

The sintered body may be reduced by utilizing a reducing gas, firing the sintered body under vacuum, or utilizing an inert gas, for example.

Examples of the reducing gas include hydrogen, methane, carbon monoxide, a mixture of these gases and oxygen, and the like.

Examples of the inert gas include nitrogen, argon, a mixture of these gases and oxygen, and the like.

The sintered body is normally reduced at 300 to 1200° C., and preferably 500 to 800° C. The sintered body is normally reduced for 0.01 to 10 hours, and preferably 0.05 to 5 hours.

The composite oxide sintered body according to the invention may be ground to obtain a target, for example. Specifically, the composite oxide sintered body is ground using a surface grinder so that the composite oxide sintered body has a surface roughness Ra of 5 μm or less, preferably 0.3 μm or less, and more preferably 0.1 μm or less.

The sputtering side of the resulting target may be mirror-finished so that the target has an average surface roughness Ra of 1000 Å or less. The target may be mirror-finished (polished) by mechanical polishing, chemical polishing, mechanochemical polishing (combination of mechanical polishing and chemical polishing), or the like. For example, the target may be polished (#2000 or more) using a fixed abrasive polisher (polishing liquid: water), or may be lapped using a free abrasive lap (polishing agent: SiC paste or the like), and then lapped using a diamond paste. The polishing method is not particularly limited.

The target may be cleaned by blowing air, or washing with running water, for example. When removing foreign matter by blowing air, it is effective to suck air using a dust collector from the side opposite to the nozzle.

The target may also be cleaned by ultrasonic cleaning or the like. When using ultrasonic cleaning, it is effective to produce ultrasonic waves at a frequency of 25 to 300K Hz. For example, it is preferable to perform ultrasonic cleaning while producing twelve types of ultrasonic waves at intervals of 25 KHz between 25 KHz and 300 KHz.

The target is then processed, and bonded to a backing plate to obtain a sputtering target that can be installed in a film-forming apparatus. It is preferable to use a backing plate made of copper. It is preferable to bond the target to the backing plate using indium solder.

The target is arbitrarily processed by cutting the target into a shape suitable for installation in a sputtering apparatus, or cutting the target for attaching a jig (e.g., backing plate).

The thickness of the target is normally 2 to 20 mm, preferably 3 to 12 mm, and particularly preferably 4 to 6 mm. A plurality of targets may be bonded to a single backing plate to obtain a single target.

The surface of the target is preferably finished using a diamond wheel having a grain size of #200 to #10,000, and more preferably #400 to #5000. If a diamond wheel having a grain size of less than #200 or more than #10,000 is used, the target may easily break.

An amorphous oxide film according to the invention is obtained by sputtering using the sputtering target formed of the composite oxide sintered body according to the invention at a film-forming temperature between room temperature and 450° C., and has an electron carrier density of less than $10^{18}/cm^3$.

The composition of the amorphous oxide film according to the invention is normally almost identical with the composition of the sputtering target used.

The film-forming temperature is preferably 50 to 300° C.

If the film-forming temperature is less than room temperature, the resulting film may contain water due to dew condensation. If the film-forming temperature exceeds 450° C., the substrate may be deformed, or the film may break due to residual stress.

Examples of the sputtering method include direct-current (DC) sputtering, alternating-current (AC) sputtering, and radio-frequency (RF) magnetron sputtering, electron beam deposition, ion plating, and the like. Among these, DC sputtering is preferable.

When using DC sputtering, the pressure inside the chamber during sputtering is normally 0.1 to 2.0 MPa, and preferably 0.3 to 0.8 MPa. When using RF sputtering, the pressure inside the chamber during sputtering is normally 0.1 to 2.0 MPa, and preferably 0.3 to 0.8 MPa.

When using DC sputtering, the power supplied during sputtering is normally 10 to 1000 W, and preferably 100 to 300 W. When using RF sputtering, the power supplied during sputtering is normally 10 to 1000 W, and preferably 50 to 250 W.

When using RF sputtering, the power supply frequency is 50 Hz to 50 MHz, and preferably 10 kHz to 20 MHz, for example.

Examples of a carrier gas used for sputtering include oxygen, helium, argon, xenon, and krypton. It is preferable to use a mixed gas of argon and oxygen. When using a mixed gas of argon and oxygen, the flow rate ratio of argon to oxygen ($Ar:O_2$) is normally 100 to 80:0 to 20, and preferably 100 to 90:0 to 10.

Glass, a resin (e.g., PET or PES), or the like may be used as the substrate.

The thickness of the resulting amorphous oxide film differs depending on the film-forming time and the sputtering method, but is normally 5 to 300 nm, and preferably 10 to 120 nm, for example.

The amorphous oxide film according to the invention may suitably be used as a channel layer of a thin film transistor. A thin film transistor that includes the amorphous oxide film according to the invention as a channel layer (semiconductor layer) is described below.

FIG. 1 is a schematic cross-sectional view illustrating a thin film transistor (field effect transistor) according to the invention.

A thin film transistor 1 includes a substrate 10, and a gate electrode 20 formed on the substrate 10. The thin film transistor 1 includes a gate insulating film 30 that covers the gate electrode 20, and a channel layer 40 stacked on the gate insulating film 30. A source electrode 50 and a drain electrode 60 are respectively formed on the ends of the channel layer 40. The thin film transistor 1 is covered with a protective film 70 in an area other than part of the source electrode 50 and the drain electrode 60.

In the thin film transistor 1, the channel layer (semiconductor layer) is formed of the amorphous oxide film according to the invention.

Since the amorphous oxide film according to the invention is amorphous, the amorphous oxide film exhibits improved adhesion to the insulating film and the protective layer. Therefore, uniform transistor characteristics can be easily obtained even if the transistor has a large area.

Note that whether or not the semiconductor layer is an amorphous film may be determined by X-ray crystal structure analysis. The semiconductor layer is amorphous when a clear peak is not observed.

Since the amorphous oxide film according to the invention has an electron carrier density of less than $10^{18}/cm^3$, the amorphous oxide film tends to become a nondegenerate semiconductor, so that the balance between the mobility and the on-off ratio is improved. Note that whether or not the semiconductor layer is a nondegenerate semiconductor may be determined by measuring a change with temperature in Hall mobility and carrier density The electron carrier density of the semiconductor layer (amorphous oxide film) is preferably $10^{13}/cm^3$ or more and less than $10^{18}/cm^3$, and more preferably $10^{14}$ to $10^{17}/cm^3$.

The semiconductor layer can be converted into a nondegenerate semiconductor by adjusting the carrier density by controlling the amount (number) of oxygen defects by adjusting the partial pressure of oxygen during film formation or performing a post-treatment.

If the semiconductor layer is a degenerate semiconductor, the threshold value may become negative (i.e., normally-on) due to an increase in off current and gate leakage current caused by excessive carriers.

The band gap of the semiconductor layer is preferably 2.0 to 6.0 eV, and more preferably 2.8 to 5.0 eV. If the band gap of the semiconductor layer is less than 2.0 eV, the field effect transistor may malfunction due to absorption of visible light. If the band gap of the semiconductor layer exceeds 6.0 eV, carriers may not be sufficiently supplied, so that the field effect transistor may not function.

The surface roughness (RMS) of the semiconductor layer is preferably 1 nm or less, more preferably 0.6 nm or less, and still more preferably 0.3 nm or less. If the surface roughness (RMS) of the semiconductor layer exceeds 1 nm, a decrease in mobility may occur.

The semiconductor layer is preferably an amorphous film that maintains at least part of the edge-sharing structure of the bixbyite structure of indium oxide. Whether or not an amorphous film including indium oxide maintains at least part of the edge-sharing structure of the bixbyite structure of indium oxide may be determined by determining a peak that indicates In—X (X is In or Zn) is between 0.30 nm and 0.36 nm using a radial distribution function (RDF) calculated by grazing incidence X-ray scattering (GIXS) that utilizes high-intensity synchrotron radiation or the like (F. Utsuno et al., Thin Solid Films, Volume 496, 2006, pages 95-98).

When the maximum value of the RDF between 0.30 nm and 0.36 nm is referred to as A, and the maximum value of the RDF between 0.36 nm and 0.42 nm is referred to as B, the interatomic distance preferably satisfies the relationship "A/B>0.7", more preferably satisfies the relationship "A/B>0.85", still more preferably satisfies the relationship "A/B>1", and particularly preferably satisfies the relationship "A/B>1.2".

If the ratio "A/B" is 0.7 or less, a decrease in mobility or an excessive increase in threshold value and S value may occur when using the semiconductor layer as the active layer of the transistor. It is assumed that this reflects a fact that the amorphous film has poor short-range order.

The average In—In bond distance is preferably 0.3 to 0.322 nm, and more preferably 0.31 to 0.32 nm. The average In—In bond distance may be determined by X-ray absorption spectroscopy.

An extended X-ray absorption fine structure (EXAFS) that extends from the absorption edge to several hundred eV is measured by X-ray absorption spectroscopy. The EXAFS is caused by electron backscattering due to atoms around the excited atom. An interference effect occurs between the forward-propagating waves and the backscattered waves. The interference depends on the electron state wavelength and the optical path length. A radial distribution function (RDF) is obtained by Fourier-transforming the EXAFS, and the average bond distance is estimated from the peak of the RDF.

The semiconductor layer is preferably an amorphous film that has a delocalized-level energy spread ($E_0$) of 14 meV or less. The non-localized-level energy width ($E_0$) of the semiconductor layer is more preferably 10 meV or less, still more preferably 8 meV or less, and particularly preferably 6 meV or less. If the non-localized-level energy spread ($E_0$) exceeds 14 meV, a decrease in mobility or an excessive increase in threshold value and S value may occur when using the semiconductor layer as the active layer of the transistor. It is conjectured that this reflects a fact that the amorphous film has poor short-range order.

The thickness of the semiconductor layer is normally 0.5 to 500 nm, preferably 1 to 150 nm, more preferably 3 to 80 nm, and particularly preferably 10 to 60 nm. If the thickness of the semiconductor layer is within the above range, excellent TFT characteristics (e.g., mobility and on-off ratio) can be obtained.

It may be difficult to uniformly form a semiconductor layer having a thickness of less than 0.5 mm on an industrial scale. On the other hand, it may take time to form a semiconductor layer having a thickness of more than 500 mm, as a result, industrial production may be difficult.

The substrate is not particularly limited. A known substrate may be used. For example, a glass substrate (e.g., alkali silicate glass, non-alkali glass, or quartz glass), a silicon substrate, a resin substrate (e.g., acrylic resin, polycarbonate, or polyethylene naphthalate (PEN)), a polymer film substrate (e.g., polyethylene terephthalate (PET) or polyamide), or the like may be used.

The thickness of the substrate is normally 0.1 to 10 mm, and preferably 0.3 to 5 mm. It is preferable that the glass substrate be chemically or thermally reinforced. When transparency and smoothness are desired, it is preferable to use a glass substrate or a resin substrate (particularly preferably a glass substrate). It is preferable to use a resin substrate or a polymer substrate when a reduction in weight is desired.

The field effect transistor preferably includes a protective film for the semiconductor layer. If a protective film for the semiconductor layer is not provided, oxygen may be removed from the surface of the semiconductor layer under vacuum or reduced pressure, so that the off current may increase, or the threshold voltage may become negative. Moreover, the field effect transistor may be affected by humidity or the like in air, so that a variation in transistor characteristics (e.g., threshold voltage) may increase.

A protective film for the semiconductor layer may be formed of an arbitrary material. For example, $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, or the like may be used. Among these, it is preferable to use $SiO_2$, $SiN_x$, $Al_2O_3$, $Y_2O_3$, $Hf_2O_3$, or $CaHfO_3$, more preferably $SiO_2$, $SiN_x$, $Y_2O_3$, $Hf_2O_3$, or $CaHfO_3$, and particularly preferably $SiO_2$, $Y_2O_3$, $Hf_2O_3$, or $CaHfO_3$.

The number of oxygen atoms of these oxides need not necessarily coincide with the stoichiometric ratio (e.g., $SiO_2$ or $SiO_x$ may be used). $SiN_x$ may include hydrogen.

The protective film may have a structure in which two or more different insulating films are stacked.

The protective film may be crystalline, polycrystalline, or amorphous. The protective film is preferably polycrystalline or amorphous (more preferably amorphous) from a viewpoint of ease of industrial production. If the protective film is not amorphous, interfacial smoothness may be poor, so that a decrease in mobility or an excessive increase in threshold value and S value may occur.

The protective film for the semiconductor layer is preferably an amorphous oxide or an amorphous nitride, and more preferably an amorphous oxide. If the protective film is not an amorphous oxide, oxygen may move from the semiconductor layer to the protective layer, so that the off current may increase, or the threshold voltage may become negative (i.e., normally-off).

The protective film for the semiconductor layer may be an organic insulating film such as poly(4-vinylphenol) (PVP) or parylene. The protective film for the semiconductor layer may have a structure in which two or more layers of an inorganic insulating film and an organic insulating film are stacked.

The gate insulating film may be formed of an arbitrary material. For example, $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, or the like may be used. Among these, it is preferable to use $SiO_2$, $BiN_x$, $Al_2O_3$, $Y_2O_3$, $Hf_2O_3$, or $CaHfO_3$, and more preferably $SiO_2$, $SiN_x$, $Y_2O_3$, $Hf_2O_3$, or $CaHfO_3$.

The number of oxygen atoms of these oxides need not necessarily coincide with the stoichiometric ratio (e.g., $SiO_2$ or $SiO_x$ may be used). $SiN_x$ may include hydrogen.

The gate insulating film may have a structure in which two or more different insulating films are stacked.

The gate insulating film may be crystalline, polycrystalline, or amorphous. The gate insulating film is preferably polycrystalline or amorphous from viewpoint of ease of industrial production.

The gate insulating film may be an organic insulating film (e.g., poly(4-vinylphenol) (PVP) or parylene). The gate insulating film may have a structure in which two or more layers of an inorganic insulating film and an organic insulating film are stacked.

The gate electrode, the source electrode, and the drain electrode may be formed of an arbitrary material. For example, a transparent electrode (e.g., indium tin oxide (ITO), indium zinc oxide, ZnO, or $SnO_2$), a metal electrode (e.g., Al, Ag, Cr, Ni, Mo, Au, Ti, Ta, or Cu), or a metal electrode formed of an alloy thereof may be used as the gate electrode, the source electrode, and the drain electrode.

If the electrode is a stacked body formed of two or more layers, the contact resistance can be reduced, and the interfacial strength can be improved. The resistance of the interface of the semiconductor layer with the electrode may be adjusted by a plasma treatment, an ozone treatment, or the like in order to reduce the contact resistance of the source electrode and the drain electrode.

In the field effect transistor according to the invention, a contact layer may be provided between the semiconductor layer and the source electrode/drain electrode. The resistance of the contact layer is preferably lower than that of the semiconductor layer.

The contact layer may be formed of a composite oxide having the same composition as that of the semiconductor layer. Specifically, the contact layer preferably includes In, Zn, Sn, and the like. If the contact layer does not include these elements, elements may move between the contact layer and the semiconductor layer, and the shift in the threshold voltage may increase when subjected to a stress test or the like.

The field effect transistor according to the invention preferably includes an oxide resistive layer having a resistance higher than that of the semiconductor layer between the semiconductor layer and the gate insulating film and/or between the semiconductor layer and the protective film.

If the oxide resistive layer is not provided, an off current may occur, the threshold voltage may become negative (i.e., normally-on), or the semiconductor layer may change in properties (i.e., deteriorate) during post-treatment (e.g., formation of the protective film or etching).

Examples of the oxide resistive layer are given below.
(1) Amorphous oxide film that is deposited at a partial pressure of oxygen higher than that when stacking the semiconductor layer and has the same composition as that of the semiconductor layer
(2) Amorphous oxide film that has the same composition as that of the semiconductor layer, but differs in compositional ratio from the semiconductor layer
(3) Amorphous oxide film that includes In and Zn, and also includes an element X that is not included in the semiconductor layer
(4) Polycrystalline oxide film that includes indium oxide as the main component
(5) Polycrystalline oxide film that includes indium oxide as the main component, and is doped with one or more positive divalent elements (e.g., Zn, Cu, Co, Ni, Mn, and Mg)

When the oxide resistive layer is an amorphous oxide film that has the same composition as that of the semiconductor layer, but differs in compositional ratio from the semiconductor layer, it is preferable that the In compositional ratio is smaller than that of the semiconductor layer.

The oxide resistive layer is preferably formed of an oxide that includes In and Zn. If the oxide resistive layer does not include an oxide that includes In and Zn, elements may move between the oxide resistive layer and the semiconductor layer, and the shift in the threshold voltage may increase when subjected to a stress test or the like.

The thin film transistor according to the invention preferably has a structure that shields the semiconductor layer from light (e.g., light-shielding layer). If the thin film transistor does not have a structure that shields the semiconductor layer from light, carrier electrons may be excited due to light that has entered the semiconductor layer, so that the off current may increase.

The light-shielding layer is preferably a thin film having absorption at 300 to 800 nm. The light-shielding layer may be provided over or under the semiconductor layer, but is preferably provided both over and under the semiconductor layer.

The light-shielding layer may also be used as the gate insulating film, a black matrix, or the like. When the light-shielding layer is provided on only one side of the semiconductor layer, it is necessary to design the structure so that light is not applied to the side of the semiconductor layer where the light-shielding layer is not provided.

Each layer of the field effect transistor may be formed by a method known in the art.

A chemical film-forming method (e.g., spraying, dipping, or CVD) or a physical film-forming method (e.g., sputtering, vacuum deposition, ion plating, or pulsed laser deposition) may be used as the film-forming method. It is preferable to use the physical film-forming method since the carrier density can be easily controlled, and the quality of the film can be easily improved. It is more preferable to use sputtering due to high productivity.

Sputtering may be performed using a sintered composite oxide target, or may be performed using a plurality of sintered targets (co-sputtering), or may be performed using an alloy target (reactive sputtering). It is preferable to use a sintered composite oxide target. When using a plurality of sintered targets (co-sputtering), or an alloy target (reactive sputtering), uniformity and reproducibility may deteriorate, or the non-localized-level energy width ($E_0$) may increase. As a result, the transistor characteristics may deteriorate (e.g., the mobility may decrease, or the threshold voltage may increase).

RF sputtering, DC sputtering, AC sputtering, or the like may be used. It is preferable to use DC sputtering or AC sputtering from the viewpoint of uniformity and mass productivity (equipment cost).

The resulting layer may be patterned by various etching methods.

The semiconductor layer is preferably deposited by DC or AC sputtering using the sputtering target according to the invention. When using DC or AC sputtering, damage that may occur during film formation can be reduced as compared with the case of using RF sputtering. This makes it possible to reduce the shift of the threshold voltage, increase the mobility, and reduce the threshold voltage and the S value when producing a field effect transistor, for example.

After forming the semiconductor layer, it is preferable to perform a heat treatment at 70 to 350° C. It is particularly preferable to perform a heat treatment at 70 to 350° C. after forming the semiconductor layer and the protective film for the semiconductor layer.

If the heat treatment temperature is less than 70° C., a decrease in thermal stability and heat resistance of the resulting transistor, a decrease in mobility, an increase in S value, or an increase in threshold voltage may occur. If the heat treatment temperature exceeds 350° C., a substrate that has low heat resistance may not be used. Moreover, the equipment cost may increase due to the heat treatment.

The heat treatment temperature is preferably 80 to 260° C., more preferably 90 to 180° C., and still more preferably 100 to 150° C. If the heat treatment temperature is 180° C. or less, a resin substrate (e.g., PEN) having low heat resistance can be used as the substrate.

The heat treatment time is normally 1 second to 24 hours. The heat treatment time may be adjusted depending on the heat treatment temperature.

When the heat treatment temperature is 70 to 180° C., the heat treatment time is preferably 10 minutes to 24 hours, more preferably 20 minutes to 6 hours, and still more preferably 30 minutes to 3 hours.

When the heat treatment temperature is 180 to 260° C., the heat treatment time is preferably 6 minutes to 4 hours, and more preferably 15 minutes to 2 hours.

When the heat treatment temperature is 260 to 300° C., the heat treatment time is preferably 30 seconds to 4 hours, and more preferably 1 minute to 2 hours.

When the heat treatment temperature is 300 to 350° C., the heat treatment time is preferably 1 second to 1 hour, and more preferably 2 seconds to 30 minutes.

The heat treatment is preferably performed in an inert gas having a partial pressure of oxygen of $10^{-3}$ Pa or less, or performed after covering the semiconductor layer with the protective layer. The reproducibility can be improved by performing the heat treatment under the above conditions.

When the thin film transistor according to the invention includes the contact layer, a contact layer having the same compositional ratio as that of the semiconductor layer may be formed under different film-forming conditions, or a contact layer that differs in compositional ratio from the semiconductor layer may be formed, or a contact layer may be formed by increasing the resistance of the contact area of the semiconductor layer with the electrode by performing a plasma treatment or an ozone treatment, or a contact layer may be formed as a layer having a resistance higher than that of the semiconductor layer by adjusting the film-forming conditions (e.g., partial pressure of oxygen) when forming the semiconductor layer, for example.

The mobility of the thin film transistor according to the invention is preferably 1 cm$^2$/Vs or more, more preferably 3 cm$^2$/Vs or more, and still more preferably 8 cm$^2$/Vs or more. If the mobility of the transistor is less than 1 cm$^2$/Vs, the transistor may not be suitable for a high-definition large-screen display due to a decrease in switching speed.

The on-off ratio of the thin film transistor according to the invention is preferably 10$^6$ or more, more preferably 10$^7$ or more, and still more preferably 10$^8$ or more.

The off current is preferably 2 pA or less, and more preferably 1 pA or less. If the off current exceeds 2 pA, a deterioration in contrast and screen uniformity may occur when using the thin film transistor according to the invention for a display.

The gate leakage current is preferably 1 pA or less. If the gate leakage current exceeds 1 pA, deterioration in contrast may occur when using the thin film transistor according to the invention for a display.

The threshold voltage is normally −5 to 10 V, preferably 0 to 4 V, more preferably 0 to 3 V, and still more preferably 0 to 2 V. If the threshold voltage is less than −5 V (i.e., normally-on), power consumption may increase since it is necessary to apply a voltage when turning the transistor off. If the threshold voltage exceeds 10 V, power consumption may increase due to an increase in driving voltage, or high mobility may be required.

The S value of the thin film transistor according to the invention is preferably 0.8 V/dec or less, more preferably 0.3 V/dec or less, still more preferably 0.25 V/dec or less, and particularly preferably 0.2 V/dec or less. If the S value exceeds 0.8 V/dec, power consumption may increase due to an increase in driving voltage. When using the thin film transistor according to the invention for an organic EL display (DC drive), power consumption can be significantly reduced by adjusting the S value to 0.3 V/dec or less.

When increasing the gate voltage from the off state, the drain current increases steeply from the off state to the on state. The S value is a value that indicates the steepness. The S value refers to an increase in gate voltage when the drain current increases by one digit (10 times) (see the following expression).

$$S\text{ value} = dVg/d\log(Ids)$$

The drain current increases more steeply as the S value decreases ("Thin Film Transistor Technology", Yasuhiro Ukai, 2007, Kogyo Chosakai Publishing Co., Ltd.). If the S value is large, it is necessary to apply a high gate voltage when switching the transistor from the on state to the off state, so that power consumption may increase.

The shift in the threshold voltage when applying a DC voltage of 10 pA to the thin film transistor according to the invention at 50° C. for 100 hours is preferably 1.0 V or less, and more preferably 0.5 V or less. If the shift in the threshold voltage exceeds 1 V, a change in image quality may occur when using the thin film transistor according to the invention for an organic EL display.

It is preferable that the hysteresis be small when changing the gate voltage using a transfer curve.

The ratio W/L of the channel width W to the channel length L of the thin film transistor according to the invention is normally 0.1 to 100, preferably 0.5 to 200, and more preferably 1 to 8. If the ratio W/L exceeds 100, a leakage current may increase, and the on-off ratio may decrease. If the ratio W/L is less than 0.1, the field-effect mobility may decrease, or pinch-off may become unclear.

The channel length L is normally 0.1 to 1000 μm, preferably 1 to 100 μm, and still more preferably 2 to 10 μm. If the channel length L is less than 0.1 μm, industrial production may be difficult. Moreover, a leakage current may increase. If the channel length L exceeds 1000 μm, the device may have an unnecessarily large size.

EXAMPLES

The invention is further described below by way of examples. Note that the invention is not limited to the following examples.

Example 1

Production of Composite Oxide Sintered Body

The following oxide powders were used as starting raw material powders. The specific surface area of each powder was measured by the BET method.

(a) Indium oxide powder (4N, specific surface area: 8 m$^2$/g)
(b) Tin oxide powder (4N, specific surface area: 8 m$^2$/g)
(c) Zinc oxide powder (4N, specific surface area: 5 m$^2$/g)

The oxide powders were weighed and mixed so that the atomic ratio "(a):(b):(c)" was 35:15:50 to prepare a raw material powder mixture. The raw material powder mixture had a specific surface area of 6.3 m$^2$/g.

The raw material powder mixture was mixed and ground using an agitator bead mill with a wet medium while checking the specific surface area of the powder mixture. The specific surface area of the ground powder mixture was larger than that of the raw material powder mixture by 2 m$^2$/g.

Zirconia beads having a diameter of 1 mm were used as the media of the agitator bead mill with a wet medium.

The ground powder mixture was dried using a spray dryer, put in a mold (diameter: 150 mm, thickness: 20 mm), and pressed using a cold press machine to obtain a shaped body. The shaped body was sintered at 1400° C. for 4 hours in an oxygen atmosphere (in which oxygen was circulated) to obtain a sintered body. The sintered body production conditions are shown in Table 1.

A sputtering target sintered body was thus obtained without performing a pre-firing step.

The sintered body was subjected to X-ray diffraction analysis. It was confirmed that the sintered body included a spinel structure compound shown by $Zn_2SnO_4$. The peak intensity I1 of a tin oxide phase (110) was not observed. The nitrogen content in the sintered body was 5 ppm or less.

The nitrogen content in the sintered body was measured using a total nitrogen analyzer (TN analyzer). The total nitrogen analyzer is used for elemental analysis of the nitrogen (N) content or the nitrogen (N) content and the carbon (C) content.

The total nitrogen analyzer decomposes a nitrogen-containing inorganic substance or a nitrogen-containing organic substance in the presence of a catalyst so that nitrogen is converted into nitrogen monoxide (NO). The NO gas is subjected to a gas-phase reaction with ozone, and light is emitted by chemiluminescence. The nitrogen content is quantitatively determined from the luminous intensity.

The following X-ray diffraction measurement conditions were used.
Apparatus: "Ultima-III" manufactured by Rigaku Corporation
X-rays: Cu-Kα radiation (wavelength: 1.5406 Å, monochromatized using a graphite monochrometor)
2θ-θ reflection method, continuous scan (1.0°/min)
Sampling interval: 0.02°
Slit DS, SS: 2/3°, RS: 0.6 mm The number of tin oxide aggregate particles, the relative density, the average crystal grain size, the bulk resistance (mΩcm), the maximum difference in density, the average hole count, the appearance (color non-uniformity), and the presence or absence of cracks in the sintered body were evaluated by the following methods. The results are shown in Table 1.

(1) Number of Tin Oxide Aggregate Particles

A small piece was cut from the sintered body, and the observation surface of the small piece was polished. Whether or not tin oxide aggregate particles were present in the polished surface was determined using an X-ray microanalyzer (EPMA). The tin characteristic X-ray image was subjected to area analysis (magnification: 200) using an analyzer "JXA-8621 MX" (manufactured by JEOL Ltd.). The results were output as an image, and the number of tin aggregate particles having a diameter of 10 μm or more was counted. The above operation was repeated 10 times for one sintered body, and the results were averaged to obtain the number of tin oxide aggregate particles per 1.00 mm$^2$.

(2) Relative Density

Samples were cut from an arbitrary ten areas of the sintered body. The density of each sample was calculated by the Archimedes method, and the average density of the samples was taken as the measured density. The product obtained by dividing the measured density by the theoretical density, which is the arithmetical average of a real density of each raw material, and by multiplying the quotient by 100 was taken as the relative density (%) of the sintered body.

(3) Variation in Relative Density

Samples were cut from an arbitrary ten areas of the sintered body. The density of each sample was calculated by the Archimedes method, and the density was divided by the above-mentioned theoretical density to obtain the average value, the maximum value and the minimum value of the relative density. A variation in relative density was calculated by the following expression based on the average relative density, the maximum relative density, and the minimum relative density. Variation in relative density=(maximum relative, density−minimum relative density)/average relative density 100(%).

(4) Average Crystal Grain Size

The sintered body was buried in a resin. The surface of the sintered body was polished using alumina particles (particle size: 0.05 μm), and observed using an X-ray microanalyzer (EPMA) ("JXA-8621MX" manufactured by JEOL Ltd.) (magnification: 5000). The maximum diameter of crystal particles observed on the surface of the sintered body within a square range of 30×30 μm was measured. The maximum diameter thus measured was taken as the average crystal grain size.

(5) Bulk Resistance (mΩcm)

The bulk resistance of the sintered body was measured in an arbitrary ten areas by a four-probe method (JIS R 1637) using a resistance meter ("Loresta" manufactured by Mitsubishi Chemical Corporation), and the average value was taken as the bulk resistance of the sintered body.

(6) Average Hole Count

The sintered body was mirror-polished in an arbitrary direction, and then etched. The texture was observed using an SEM, and the number of holes having a diameter of 1 μm or more per unit area was counted.

(7) Appearance (Color Non-Uniformity)

The sintered body was observed with the naked eye at a position 50 cm away from the sintered body (north window light), and evaluated as follows.
Excellent: No color non-uniformity was observed.
Good: Almost no color non-uniformity was observed.
Fair: Some color non-uniformity was observed.
Bad: Color non-uniformity was observed.

(8) Cracks

The sintered body was observed with the naked eye at a position 50 cm away from the sintered body (north window light), and the presence or absence of cracks was determined.
Good: No cracks were observed.
Bad: Cracks were observed.

[Production of Sputtering Target]

A target sintered body was cut from the sintered body. The side of the target sintered body was cut using a diamond cutter, and the surface was ground using a surface grinder to obtain a target material having a surface roughness Ra of 5 μm or less. The surface of the target material was cleaned by blowing air, and then subjected to ultrasonic cleaning for 3 minutes while producing twelve types of ultrasonic waves at intervals of 25 KHz between 25 KHz and 300 KHz. The target material was then bonded to a backing plate made of oxygen-free copper using indium solder to obtain a sputtering target. The sputtering target had a surface roughness Ra of 0.5 μm or less, and had a ground surface without directivity.

[Production of TFT Panel]

A bottom-gate TFT element was produced by the following steps.

Molybdenum metal was deposited by RF sputtering on a glass substrate at room temperature, and patterned by wet etching to obtain a gate electrode. SiO$_x$ was then formed in a film on the substrate using a plasma-enhanced chemical vapor deposition apparatus (PECVD apparatus) to obtain a gate insulating film. The sputtering target was installed in a DC magnetron sputtering apparatus, and an amorphous oxide film was deposited on the gate insulating film at a film-forming temperature of 50° C. The electron carrier density of the amorphous oxide film measured using a Hall effect measuring apparatus (manufactured by Toyo Corporation) was $5 \times 10^{17}$/cm$^3$. The amorphous oxide film was then patterned by dry etching to form a semiconductor layer (thickness: 40 nm). SiO$_x$ was then formed in a film using a PECVD apparatus, and patterned by dry etching (RIE) to obtain a first protective layer (etch stopper). A Ti/Al/Ti stacked film was then formed in a film by DC sputtering. The Ti/Al/Ti stacked film was then patterned by dry etching (RIE) to form a source electrode and a drain electrode. SiN$_x$ was then formed in a film as a second protective layer using a PECVD apparatus, and a contact hole was formed (i.e., connected to an external wire). The substrate was then heated at 280° C. for 1 hour in air to obtain a transistor having a channel length of 10 μm and a channel width of 100 μm. One hundred (10×10) thin film transistors (TFT) were formed on the substrate (TFT panel) at equal intervals.

The characteristics of each transistor formed on the TFT panel were evaluated. Each transistor (excluding a transistor that was short-circuited) had a field-effect mobility of 12 to 16 cm$^2$/(V·sec) and a threshold voltage of 0 to 1.0 V. Almost no difference in characteristics was observed between the adjacent thin film transistors (TFT).

Thin film transistors (5 batches) were successively produced using the sputtering target, and the characteristics of the TFT panel were evaluated by the following methods. The results are shown in Table 1.

(9) Uniformity of TFT Characteristics

The ratio (maximum value/minimum value) of the maximum value to the minimum value of the on current (Vg=6 V) of a single panel was calculated. The ratio (maximum value/minimum value) was evaluated in accordance with the following standard.

Excellent: 1.05 or less
Good: 1.10 or less
Fair: 1.20 or less
Bad: More than 1.20

(10) Reproducibility of TFT Characteristics

The ratio of the average field-effect mobility of the first batch to the average field-effect mobility of the 100th batch (first batch/100th batch) was calculated.

(11) Yield of TFT

Each thin film transistor (TFT) formed on each panel (10 batches) (1000 transistors in total) was driven, and the number of thin film transistors (TFT) that could be driven was counted. A thin film transistor (TFT) that was short-circuited and could not be driven was excluded. The number of thin film transistors (TFT) that could be driven was evaluated in accordance with the following standard.

Excellent: 999 or more
Good: 995 or more and less than 999
Fair: 990 or more and less than 995
Bad: Less than 990

Examples 2 to 7 and Comparative Examples 1 to 8

A sintered body was produced and evaluated, and a TFT panel was produced and evaluated in the same manner as in Example 1, except for using starting raw material powders shown in Tables 1 and 2, and producing the sintered body under conditions shown in Tables 1 and 2. The results are shown in Tables 1 and 2.

In Comparative Example 1, a pre-firing step was performed at 900° C. for 8 hours in air after grinding the powder mixture. In Comparative Example 1, the powder mixture was granulated by 12 hours of air-drying (the powder mixture was granulated using a spray dryer in Example 1).

Examples 8 to 13

A sintered body and a target were produced in the same manner as in Example 1, except that the oxide powders were weighed in an atomic ratio shown in Table 3, and sintered under the following conditions. The results are shown in Table 3.

Temperature increase rate: 1° C./min
Sintering temperature: 1480° C.
Sintering time: 12 hours
Processing: Each side of a sintered body having a thickness of 9 mm was ground by 2 mm.

The sintered body obtained in each example was subjected to X-ray diffraction analysis. The results are given below.

Example 8

The Sintered Body Mainly Included a Bixbyite Structure Compound Shown by $In_2O_3$ and a Spinel Structure Compound Shown by $Zn_2SnO_4$ Examples 9 to 13

Structure Compound Shown by $Zn_2SnO_4$
The Sintered Body Mainly Included a Spinel

TABLE 1

| | | | Example 1 | Example 2 | Example 3 | Example 4 | Example 5 | Example 6 | Example 7 |
|---|---|---|---|---|---|---|---|---|---|
| Production conditions | Specific surface area [$m^2$/g] | $In_2O_3$ | 8 | 8 | 8 | 8 | 8 | 12 | 4 |
| | | $SnO_2$ | 8 | 8 | 8 | 8 | 8 | 12 | 4 |
| | | ZnO | 5 | 5 | 5 | 5 | 5 | 8 | 3 |
| | Specific surface area of powder mixture | Before mixing and grinding | 6.3 | 6.3 | 6.3 | 6.3 | 6.3 | 9.8 | 3.4 |
| | | After mixing and grinding | 8.3 | 8.3 | 8.3 | 8.3 | 8.3 | 12.2 | 5.3 |
| | Granulation method | | Spray dryer | Spray dryer | Spray dryer | Spray dryer | Spray dryer | Spray dryer | Spray dryer |
| | Pre-firing step | | Not performed | Not performed | Not performed | Not performed | Not performed | Not performed | Not performed |
| | Sintering atmosphere | | Oxygen stream | Oxygen stream | Oxygen stream | Oxygen stream | Oxygen stream | Oxygen stream | Oxygen stream |
| | Oxygen flow rate [L/min] | | 8 | 8 | 8 | 8 | 8 | 8 | 8 |
| | Sintering temperature [° C.] | | 1400 | 1400 | 1400 | 1400 | 1350 | 1400 | 1400 |
| | Sintering time [h] | | 4 | 8 | 12 | 24 | 8 | 4 | 4 |
| Properties of sintered body | Number of tin oxide aggregate particles | | 0 | 0 | 0 | 0 | 0 | 1 | 1 |
| | Relataive density [%] | Average | 98.1 | 99.1 | 99.2 | 99.3 | 99.1 | 96.0 | 98.1 |
| | | Maximum | 98.3 | 99.2 | 99.2 | 99.4 | 99.2 | 96.2 | 98.3 |
| | | Minimum | 97.9 | 99 | 99.1 | 99.1 | 98.9 | 95.8 | 97.9 |
| | Variation in relative density | | 0.41 | 0.20 | 0.10 | 0.30 | 0.30 | 0.42 | 0.41 |
| | Crystal grain size [μm] | | 3 | 3 | 4 | 5 | 5 | 6 | 8 |
| | Bulk resistance [mΩcm] | | 3.8 | 3.2 | 5.8 | 25 | 4.1 | 4.8 | 3.7 |
| | Average hole count [per/$mm^2$] | | 80 | 70 | 60 | 50 | 70 | 90 | 85 |
| | Appearance | | Excellent | Excellent | Excellent | Excellent | Excellent | Excellent | Excellent |
| | Cracks | | Good | Good | Good | Good | Good | Good | Good |
| TFT characteristices | Uniformity | | Excellent | Excellent | Excellent | Excellent | Excellent | Excellent | Excellent |
| | Reproducibility | | 1.02 | 1.03 | 1.03 | 1.03 | 1.06 | 1.08 | 1.08 |
| | Yield | | Excellent | Excellent | Excellent | Excellent | Excellent | Good | Good |

TABLE 2

|  |  |  | Com. Ex. 1 | Com. Ex. 2 | Com. Ex. 3 | Com Ex. 4 | Com. Ex. 5 | Com. Ex. 6 | Com. Ex. 7 | Com. Ex. 8 |
| --- | --- | --- | --- | --- | --- | --- | --- | --- | --- | --- |
| Production conditions | Specific surface area [m²/g] | $In_2O_3$ | 3 | 3 | 16 | 8 | 8 | 4 | 8 | 8 |
| | | $SnO_2$ | 3 | 3 | 16 | 8 | 8 | 3 | 8 | 8 |
| | | ZnO | 2 | 2 | 16 | 5 | 5 | 2 | 5 | 5 |
| | Specific surface area of powder mixture | Before mixing and grinding | 2.4 | 2.4 | 16 | 6.3 | 6.3 | 2.8 | 6.3 | 6.3 |
| | | After mixing and grinding | 4.3 | 4.3 | 18.2 | 8.4 | 8.4 | 4.8 | 6.4 | 10.2 |
| | Granulation method | | Air-drying | Spray dryer | Air-drying | Spray dryer | Spray dryer | Spray dryer | Spray dryer | Spray dryer |
| | Pre-firing step | | Performed | Not performed | Performed | Not performed | Not performed | Not performed | Not performed | Not performed |
| | Sintering atmosphere | | Air | Oxygen stream | Air | Oxygen stream | Oxygen stream | Oxygen stream | Oxygen stream | Oxygen stream |
| | Oxygen flow rate [L/min] | | — | 8 | — | 8 | 8 | 8 | 8 | 8 |
| | Sintering temperature [° C.] | | 1400 | 1400 | 1400 | 1150 | 1600 | 1400 | 1150 | 1600 |
| | Sintering time [h] | | 4 | 4 | 4 | 4 | 4 | 4 | 4 | 4 |
| Properties of sintered body | Number of tin oxide aggregate particles | | 21 | 4 | 18 | 1 | 1 | 3 | 5 | 1 |
| | Relative density [%] | Average | 88.0 | 94.4 | 85.5 | 77.9 | 98.6 | 94.4 | 77.9 | 98.6 |
| | | Maximum | 88.6 | 94.7 | 86.1 | 78.6 | 99.1 | 94.7 | 78.9 | 99.1 |
| | | Minimum | 87.4 | 94.1 | 84.9 | 77.2 | 98.0 | 94.1 | 76.9 | 98.0 |
| | Variation in relative density | | 1.36 | 0.64 | 1.40 | 1.80 | 1.12 | 0.64 | 2.57 | 1.12 |
| | Crystal grain size [µm] | | 12 | 8 | 10 | 4 | 16 | 8 | 4 | 23 |
| | Bulk resistance [mΩcm] | | 15.0 | 6.0 | 12.0 | 35.0 | 8.0 | 6 | 45 | 8.0 |
| | Average hole count [per/mm²] | | 210 | 120 | 280 | 900 | 600 | 120 | 1200 | 800 |
| | Appearance | | Good | Excellent | Good | Good | Fair | Exellent | Fair | Fair |
| | Cracks | | Good | Good | Good | Good | Bad | Good | Good | Bad |
| Characteristics of TFT | Uniformity | | Good | Good | Good | Bad | Fair | Good | Bad | Fair |
| | Reproducibility | | 1.82 | 1.35 | 1.72 | 1.38 | 1.34 | 1.33 | 1.53 | 1.34 |
| | Yield | | Bad | Fair | Bad | Good | Good | Fair | Fair | Good |

TABLE 3

| | | Examples | | | | | |
| --- | --- | --- | --- | --- | --- | --- | --- |
| | | 8 | 9 | 10 | 11 | 12 | 13 |
| Composition (at %) | In/(In + Sn + Zn) | 0.38 | 0.23 | 0.14 | 0.25 | 0.25 | 0.20 |
| | Sn/(In + Sn + Zn) | 0.15 | 0.14 | 0.23 | 0.14 | 0.10 | 0.14 |
| | Zn/(In + Sn + Zn) | 0.47 | 0.63 | 0.63 | 0.61 | 0.65 | 0.66 |
| Evaluation of targets | Number of tin oxide aggregate particles | 0 | 0 | 0 | 0 | 0 | 0 |
| | Crystal grain size (µm) | 4 | 4 | 3 | 4 | 3 | 4 |
| | Relative density (%) | 99 | 99 | 93 | 99 | 99 | 99 |
| | Variation in relative density | 0.4 | 0.4 | 0.4 | 0.4 | 0.4 | 0.4 |
| | Bulk resistance (mΩcm) | 3 | 2 | 90 | 2 | 1 | 2 |
| | Average hole count (per mm²) | 75 | 75 | 75 | 75 | 75 | 75 |
| | Appearance | Excellent | Excellent | Excellent | Excellent | Excellent | Excellent |
| | Cracks | Good | Good | Good | Good | Good | Good |

INDUSTRIAL APPLICABILITY

The composite oxide sintered body according to the invention may be used as a sputtering target. A thin film formed using the sputtering target according to the invention may be used as a channel layer of a transistor.

Although only some exemplary embodiments and/or examples of the invention have been described in detail above, those skilled in the art will readily appreciate that many modifications are possible in the exemplary embodiments and/or examples without materially departing from the novel teachings and advantages of the invention. Accordingly, all such modifications are intended to be included within the scope of the invention.

The documents cited in the specification are incorporated herein by reference in their entirety.

The invention claimed is:

1. A composite oxide sintered body comprising In, Zn, and Sn, and having a relative density of 90% or more, an average crystal grain size of 10 µm or less, a bulk resistance of 30 mΩcm or less and a nitrogen content of 5 ppm or less, and having a number of tin oxide aggregate particles having a diameter of 10 µm or more being 2.5 or less per mm².

2. The composite oxide sintered body according to claim 1, the composite oxide sintered body having a variation in relative density in a plane direction of 1% or less, and an average hole count of 800 or less per mm².

3. The composite oxide sintered body according to claim 1, wherein the atomic ratio of In, Zn, and Sn satisfies the following expressions:

$0<In/(In+Sn+Zn)<0.75$ $0.25\leq Zn/(In+Sn+Zn)\leq 0.75$, and $0<Sn/(In+Sn+Zn)<0.50$.

4. A sputtering target comprising the composite oxide sintered body according to claim 1.

5. The sputtering target according to claim 4, wherein metal atoms included in the composite oxide sintered body consist essentially of In, Sn, and Zn, and the ratio of the metal atoms satisfies the following expressions:

$0<In/(In+Sn+Zn)<0.40$, $0.25\leq Zn/(In+Sn+Zn)<0.70$, and $0.05<Sn/(In+Sn+Zn)<0.25$.

6. An amorphous oxide film obtained by sputtering using the sputtering target according to claim 4 at a film-forming temperature between room temperature and 450° C., the amorphous oxide film having an electron carrier density of less than $10^{18}/cm^3$.

7. A thin film transistor comprising the amorphous oxide film according to claim 6 as a channel layer.

* * * * *